United States Patent
Kim et al.

(10) Patent No.: US 9,024,653 B2
(45) Date of Patent: May 5, 2015

(54) INPUT BUFFER CIRCUIT

(71) Applicant: Samsung Electro-Mechanics Co., Ltd., Suwon, Gyunggi-do (KR)

(72) Inventors: Dong Hwan Kim, Gyunggi-do (KR); Sung Man Pang, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 43 days.

(21) Appl. No.: 13/840,510

(22) Filed: Mar. 15, 2013

(65) Prior Publication Data
US 2014/0118025 A1 May 1, 2014

(30) Foreign Application Priority Data
Oct. 30, 2012 (KR) .................. 10-2012-0121227

(51) Int. Cl.
*H03K 17/16* (2006.01)
*H03K 19/0948* (2006.01)

(52) U.S. Cl.
CPC .................................. *H03K 19/0948* (2013.01)

(58) Field of Classification Search
CPC ................... H03K 19/0948; H03K 19/01742; G11C 7/1051; G11C 7/1057
USPC ...................................... 326/82, 83, 119, 121
See application file for complete search history.

(56) References Cited

U.S. PATENT DOCUMENTS

| 6,225,830 B1 * | 5/2001 | Ra ................................. 326/121 |
| 2009/0072864 A1 * | 3/2009 | Hagino ........................ 326/121 |

FOREIGN PATENT DOCUMENTS

| KR | 2001-0039064 A | 5/2001 |
| KR | 2002-0039745 A | 5/2002 |

\* cited by examiner

*Primary Examiner* — Don Le
(74) *Attorney, Agent, or Firm* — McDermott Will & Emery LLP (57) ABSTRACT

There is provided an input buffer circuit having hysteresis characteristics. The input buffer circuit includes: a first operating unit performing a NOR operation on an input signal and a first signal; a second operating unit performing a NAND operation on the input signal and a second signal; and an inverting unit inverting outputs of the first and second operating units to generate a second signal and a first signal, respectively, wherein reference levels of the first and second operating units determining a high or low level of the input signal are set to be different.

12 Claims, 5 Drawing Sheets

INPUT BUFFER CIRCUIT

CROSS-REFERENCE TO RELATED APPLICATIONS

This application claims the priority of Korean Patent Application No. 10-2012-0121227 filed on Oct. 30, 2012, in the Korean Intellectual Property Office, the disclosure of which is incorporated herein by reference.

BACKGROUND OF THE INVENTION

1. Field of the Invention

The present invention relates to an input buffer circuit having hysteresis characteristics.

2. Description of the Related Art

The present invention relates to an input buffer circuit having hysteresis characteristics. Generally, in order to prevent transition of an output signal due to noise characteristics of an input signal, a Schmitt trigger circuit having hysteresis characteristics is used.

The following Related Art Document, which relates to an input buffer circuit having reverse polarity hysteresis capable of obtaining a rapid response speed, has problems in that it is difficult to determine sizes of an n-type metal oxide semiconductor (NMOS) transistor and a p-type MOS (PMOS) transistor of an input terminal for determining a state of an output and it is difficult to determine a level of hysteresis.

RELATED ART DOCUMENT

Korean Patent Laid-Open Publication No. 2002-0039745

SUMMARY OF THE INVENTION

An aspect of the present invention provides an input buffer circuit capable of easily determining a level of hysteresis by adjusting sizes of a p-type metal oxide semiconductor (PMOS) transistor and an n-type MOS (NMOS) transistor of an input terminal.

According to an aspect of the present invention, there is provided an input buffer circuit including: a first operating unit performing a NOR operation on an input signal and a first signal; a second operating unit performing a NAND operation on the input signal and a second signal; and an inverting unit inverting outputs of the first and second operating units to generate a second signal and a first signal, respectively, wherein reference levels of the first and second operating units determining a high or low level of the input signal are set to be different.

The reference level of the first operating unit may be higher than that of the second operating unit.

The first operating unit may include a two-input NOR gate receiving the input signal and the first signal.

The second operating unit may include a two-input NAND gate receiving the input signal and the second signal.

The inverting unit may include: a first inverter inverting the output of the first operating unit to generate the second signal; and a second inverter inverting the output of the second operating unit to generate the first signal.

According to another aspect of the present invention, there is provided an input buffer circuit including: a two-input NOR gate including a first p-type metal oxide semiconductor (PMOS) transistor and a first n-type MOS (NMOS) transistor respectively having an input signal applied thereto and a second PMOS transistor and a second NMOS transistor respectively having a first signal applied thereto; a first inverter inverting an output signal of the two-input NOR gate to generate a second signal; a two-input NAND gate including a third PMOS transistor and a third NMOS transistor respectively having the input signal applied thereto and a fourth PMOS transistor and a fourth NMOS transistor respectively having the second signal applied thereto; and a second inverter inverting an output signal of the two-input NAND gate to generate the first signal, wherein reference levels of the two-input NOR gate and the two-input NAND gate determining a high or low level of the input signal are set to be different.

The reference level of the two-input NOR gate may be higher than that of the two-input NAND gate.

The reference level of the two-input NOR gate may be determined by ratios of widths to lengths of the first PMOS transistor and the first NMOS transistor, and the reference level of the two-input NAND gate may be determined by ratios of widths to lengths of the third PMOS transistor and the third NMOS transistor.

The ratio of a width to a length of the first PMOS transistor may be larger than that of the first NMOS transistor.

The ratio of a width to a length of the third PMOS transistor may be smaller than that of the third NMOS transistor.

According to another aspect of the present invention, there is provided an input buffer circuit including: a two-input NOR gate including a first PMOS transistor array and a first NMOS transistor respectively having an input signal applied thereto and a second PMOS transistor and a second NMOS transistor respectively having a first signal applied thereto; a first inverter inverting an output signal of the two-input NOR gate to generate a second signal; a two-input NAND gate including a third PMOS transistor and a third NMOS transistor array respectively having the input signal applied thereto and a fourth PMOS transistor and a fourth NMOS transistor respectively having the second signal applied thereto; and a second inverter inverting an output signal of the two-input NAND gate to generate the first signal, wherein reference levels of the two-input NOR gate and the two-input NAND gate determining a high or low level of the input signal are set to be different.

The reference level of the two-input NOR gate may be higher than that of the two-input NAND gate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 1:
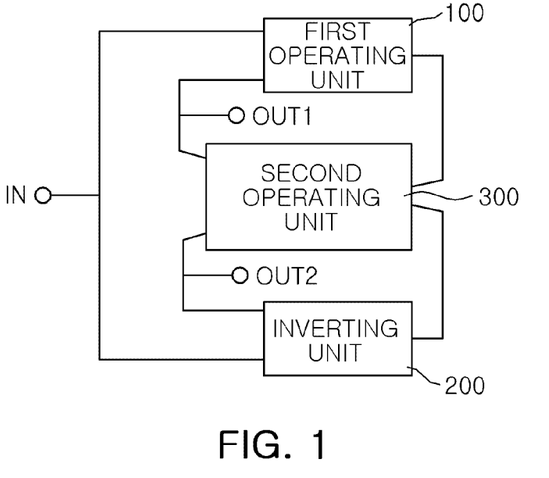
FIG. 1 is a block diagram showing an input buffer circuit according to an embodiment of the present invention.
Figure 2:
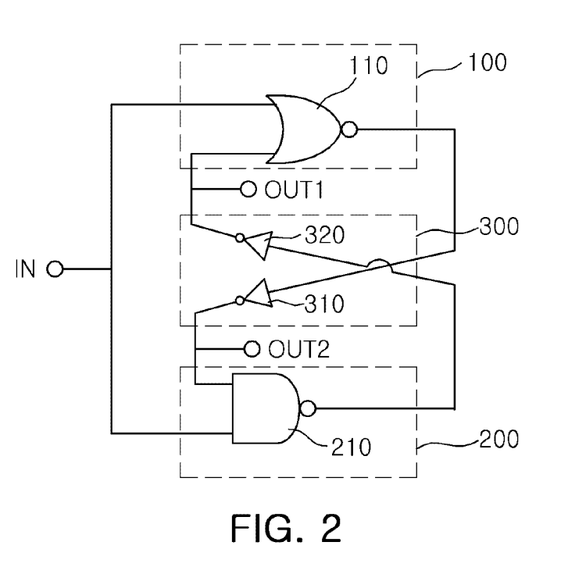
FIG. 2 is a diagram showing the input buffer circuit according to the embodiment of the present invention using a logic operator.

FIG. 1 is a block diagram showing an input buffer circuit according to an embodiment of the present invention; and FIG. 2 is a diagram showing the input buffer circuit according to the embodiment of the present invention using a logic operator. The input buffer circuit according to the embodiment of the present invention will hereinafter be described with reference to FIGS. 1 and 2.

The input buffer circuit according to the embodiment of the present invention may include a first operating unit 100, a second operating unit 200, and an inverting unit 300.

The first operating unit 100 may perform a NOR operation on an input signal applied through an input terminal IN and a first signal, and an output signal of the first operating unit 100 may be provided to the inverting unit 300. The second operating unit 200 may perform a NAND operation on the input signal and a second signal, and an output signal of the second operating unit 200 may be provided to the inverting unit 300. In the embodiment of the present invention, the first operating unit 100 may be implemented as a two-input NOR gate 110, and the second operating unit 200 may be implemented as a two-input NAND gate 210. However, the first and second operating units 100 and 200 are not limited to being implemented as the above-mentioned logic gates, respectively, but may also be implemented as other logic gates.

Reference levels of the first and second operating units 100 and 200 determining a high or low level of the input signal may be set to be different. In the case in which a voltage level of the input signal is equal to or higher than the reference level, it may be a high level input signal, and in the case in which the voltage level of the input signal is lower than the reference level, it may be a low level input signal. The reference levels of the first and second operating units 100 and 200 are set to be different, whereby a voltage level of an output signal may have hysteresis characteristics according to the voltage level of the input signal.

In the embodiment of the present invention, the reference level of the first operating unit 100 may be higher than that of the second operating unit 200.

More specifically, in the case in which the voltage level of the input signal is lower than the reference level of the first operating unit 100 and the reference level of the second operating unit 200, both of the first and second operating units 100 and 200 may determine that the voltage level of the input signal is low. In addition, in the case in which the voltage level of the input signal is equal to or higher than the reference level of the second operating unit 200 and lower than the reference level of the first operating unit 100, the first operating unit 100 may determine that the voltage level of the input signal is low, and the second operating unit 200 may determine that the voltage level of the input signal is high. Further, in the case in which the voltage level of the input signal is equal to or higher than the reference level of the first operating unit 100 and the reference level of the second operating unit 200, both of the first and second operating units 100 and 200 may determine that the voltage level of the input signal is high.

The inverting unit 300 may invert output signals of the first and second operating units 100 and 200 to generate a second signal and a first signal, respectively. The inverting unit 300 may include a first inverter 310 providing the second signal generated by inverting the output signal of the first operating unit 100 to the second operating unit 200 and a second inverter 320 providing the first signal generated by inverting the output signal of the second operating unit 200 to the first operating unit 100.

Output terminals OUT1 and OUT2 through which an output voltage of the input buffer circuit is output may be changed according to an increase/decrease in the voltage level of the input signal. For example, in the case in which the voltage level of the input signal is increased, the output voltage of the input buffer circuit may be output through the first output terminal OUT1, and in the case in which the voltage level of the input signal is decreased, the output voltage of the input buffer circuit may be output through the second output terminal OUT2. Unlike this, in the case in which the voltage level of the input signal is decreased, the output voltage of the input buffer circuit may be set to be output through the first output terminal OUT1, and in the case in which the voltage level of the input signal is increased, the output voltage of the input buffer circuit may be set to be output through the second output terminal OUT2.

Figure 3:
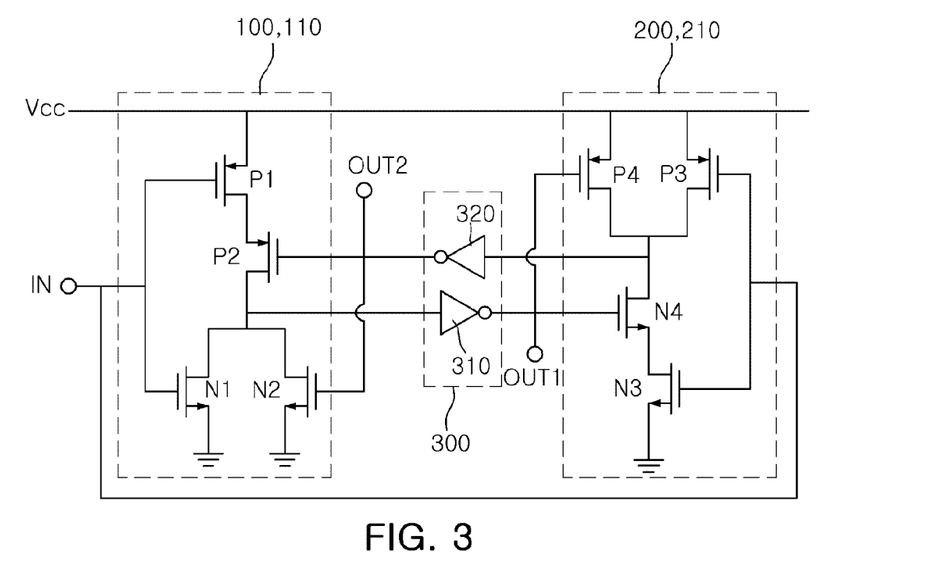
FIG. 3 is a circuit diagram of the input buffer circuit according to the embodiment of the present invention.

FIG. 3 is a circuit diagram of the input buffer circuit according to the embodiment of the present invention. Hereinafter, the input buffer circuit of FIGS. 1 through 3 will be described in more detail with reference to FIG. 3.

Referring to FIG. 3, the input buffer circuit may include the first operating unit 100 including the two-input NOR gate 110, the second operating unit 200 including the two-input NAND gate 210, and the inverting unit 300 including the first and second inverters 310 and 320.

The two-input NOR gate 110 may include a first p-type metal oxide semiconductor (PMOS) transistor P1 and a first n-type MOS (NMOS) transistor N1, respectively having the input signal applied thereto, and a second PMOS transistor P2 and a second NMOS transistor N2 respectively having the first signal applied thereto.

More specifically, the first PMOS transistor P1 may have a gate to which the input signal is applied, a source to which a driving voltage $V_{CC}$ is applied, and a drain connected to a source of the second PMOS transistor P2. The second PMOS transistor P2 may have a gate to which the first signal is applied and a drain connected to drains of the first and second NMOS transistors N1 and N2.

The first NMOS transistor N1 may have a gate to which the input signal is applied and a source connected to a ground, and the second NMOS transistor N2 may have a gate to which the first signal is applied and a source connected to the ground.

The two-input NAND gate 210 may include a third PMOS transistor P3 and a third NMOS transistor N3, respectively having the input signal applied thereto, and a fourth PMOS transistor P4 and a fourth NMOS transistor N4, respectively having the second signal applied thereto.

More specifically, the third NMOS transistor N3 may have a gate to which the input signal is applied, a source connected to the ground, and a drain connected to a source of the fourth NMOS transistor N4. The fourth NMOS transistor N4 may have a gate to which the second signal is applied and a drain connected to drains of the third and fourth PMOS transistors P3 and N4.

The third PMOS transistor P3 may have a gate to which the input signal is applied and a source to which the driving voltage $V_{CC}$ is applied, and the fourth PMOS transistor P4 may have a gate to which the second signal is applied and a source to which the driving voltage $V_{CC}$ is applied.

The reference levels of the two-input NOR gate 110 and the two-input NAND gate 210 determining the high or low level of the input signal may be different. As an example, the reference level of the two-input NOR gate 110 may be higher than that of the two-input NAND gate 210.

Hereinafter, a description will be provided on the assumption that the reference level (hereinafter, referred to as a first reference level) of the two-input NOR gate 110 is higher than the intermediate level ($V_{CC}/2$) of the driving voltage and the reference level (hereinafter, referred to as a second reference level) of the two-input NAND gate 210 is lower than the intermediate level ($V_{CC}/2$) of the driving voltage.

Figure 4:
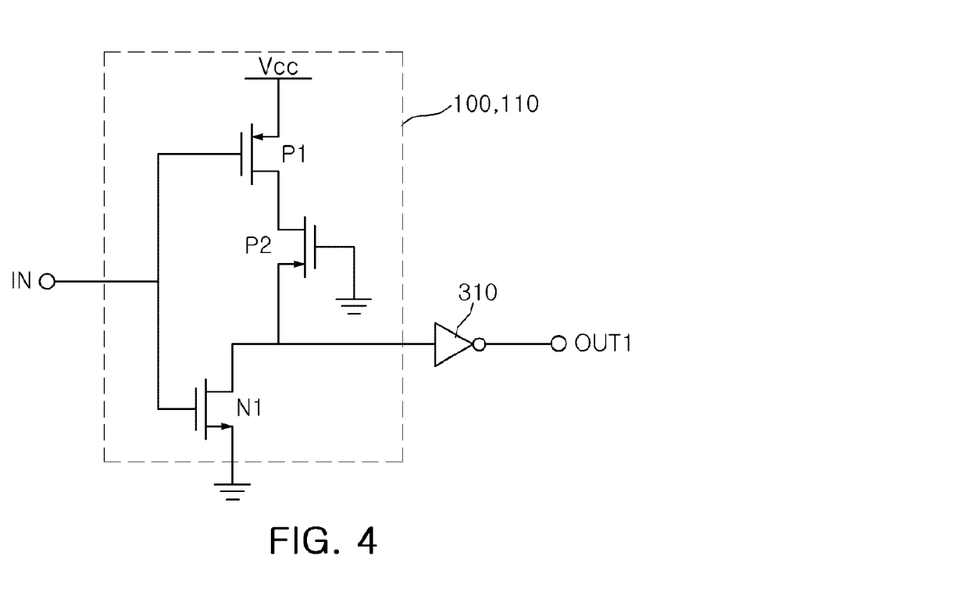
FIG. 4 is a diagram showing an equivalent circuit of a two-input NOR gate in the case in which a voltage level of an input signal is between an intermediate level ($V_{CC}/2$) of a driving voltage and a first reference level.

FIG. 4 is a diagram showing an equivalent circuit of a two-input NOR gate 110 in the case in which a voltage level of an input signal is between an intermediate level ($V_{CC}/2$) of a driving voltage and a first reference level.

In the case in which the voltage level of the input signal is between a half ($V_{CC}/2$) of the driving voltage and the first reference level, since an output signal of the two-input NAND gate 210 is a high level signal, the first signal generated by inverting the two-input NAND gate 210 may be a low level signal. Since the first signal is the low level signal, the second PMOS transistor P2 is turned on and the second NMOS transistor N2 is turned off, such that the two-input NOR gate 110 may become equivalent to the circuit shown in FIG. 4.

Since the second PMOS transistor P2 is in a turned-on state, the first reference level may be determined by the first NMOS transistor N1 and the first PMOS transistor P1. More specifically, a current $I_{P1}$ flowing to the first PMOS transistor P1 may be represented by the following Equation 1. $\mu^*Cox$ indicates trans-conductance determined by a manufacturing process, W indicates a channel width of a MOSFET, L indicates a channel length of the MOSFET, and $V_{TH}$ indicates a threshold voltage of the transistor. Here, $\beta$ is $(\mu^*Cox)^*(W/L)$.

$$I_{P1} = \frac{\mu_{P1} * C_{OXP1}}{2} * \left(\frac{W_{P1}}{L_{P1}}\right) * (V_{CC} - V_{IH} - V_{THP1})^2 \quad \text{[Equation 1]}$$

$$I_{P1} = \frac{\beta_{P1}}{2} * (V_{CC} - V_{IH} - V_{THP1})^2$$

In addition, a current $I_{N1}$ flowing to the first NMOS transistor N1 may be represented by the following Equation 2.

$$I_{N1} = \frac{\mu_{N1} * C_{OXN1}}{2} * \left(\frac{W_{N1}}{L_{N1}}\right) * (V_{IH} - V_{THN1})^2 \quad \text{[Equation 2]}$$

Since the current flows from the first PMOS transistor P1 to the first NMOS transistor N1, the first reference level may be represented by the following Equation 3. Here, $\alpha_1$ is $(V_{IH}-V_{THN})/(V_{CC}-V_{IH}-V_{THP})$.

$$V_{IH} = \frac{\alpha_1 * V_{CC} - \alpha_1 * V_{THP} + V_{THN}}{\alpha_1 + 1} \quad \text{[Equation 3]}$$

Here, in the case in which the driving voltage $V_{CC}$, a threshold voltage of the first PMOS transistor P1, and a threshold voltage of the first NMOS transistor N1 are constant, the first reference level may be changed by changing a value of $\alpha_1$. A maximum value of $V_{IH}$ that may be changed by changing the value of $\alpha_1$ may be represented by the following Equation 4.

$$\lim_{\alpha_1 \to \infty} V_{IH} = V_{CC} - V_{THP} \quad \text{[Equation 4]}$$

As seen in Equation 4, when the value of $\alpha_1$ is increased, the voltage $V_{IH}$ may be increased up to $V_{CC}-V_{THP}$. The case of increasing $\alpha_1$ corresponds to the case in which a ratio (W/L) of a width to a length of the first PMOS transistor P1 is designed to be larger than that of the first NMOS transistor N1.

That is, the ratio (W/L) of a width to a length of the first PMOS transistor P1 is designed to be larger than a ratio (W/L) of a width to a length of the second NMOS transistor N2, whereby the first reference level may be easily changed.

Figure 5:
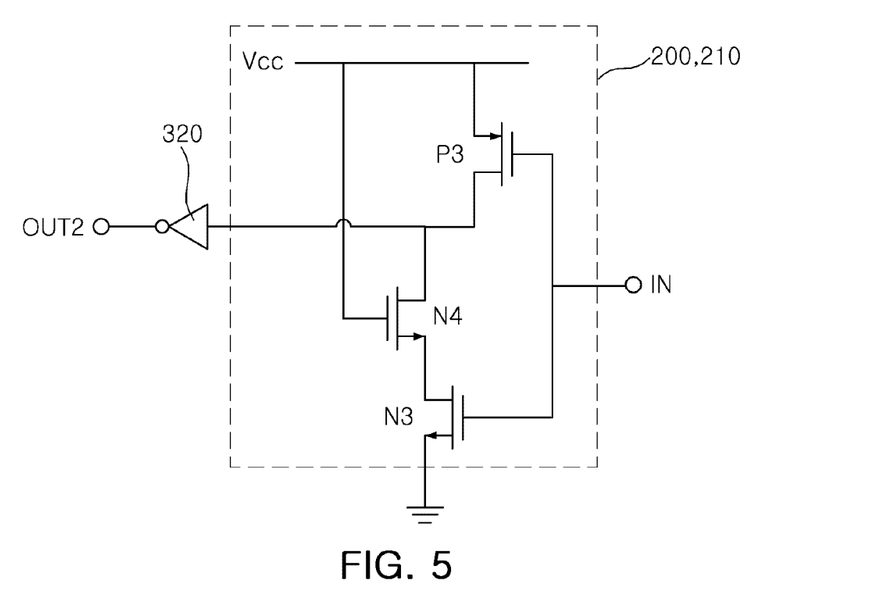
FIG. 5 is a diagram showing an equivalent circuit of a two-input NAND gate in the case in which the voltage level of the input signal is between a second reference level and the intermediate level ($V_{CC}/2$) of the driving voltage.

FIG. 5 is a diagram showing an equivalent circuit of a two-input NAND gate 210 in the case in which the voltage level of the input signal is between a second reference level and the intermediate level ($V_{CC}/2$) of the driving voltage.

In the case in which the voltage level of the input signal is between the second reference level and the intermediate level ($V_{CC}/2$) of the driving voltage, since an output signal of the two-input NOR gate 110 is a low level signal, the second signal generated by inverting the two-input NOR gate 110 may be a high level signal. Since the second signal is the high level signal, the fourth NMOS transistor N4 is turned on and the fourth PMOS transistor P4 is turned off, such that the two-input NAND gate 210 may become equivalent to the circuit shown in FIG. 5.

Since the fourth NMOS transistor N4 is in a turned-on state, the second reference level may be determined by the third NMOS transistor N3 and the third PMOS transistor P3. More specifically, a current $I_{P3}$ flowing to the third PMOS transistor P3 may be represented by the following Equation 5. As described above, $\mu^*Cox$ indicates trans-conductance determined by a manufacturing process, W indicates a channel width of a MOSFET, L indicates a channel length of the MOSFET, and $V_{TH}$ indicates a threshold voltage of the transistor. Here, $\beta$ is $(\mu^*Cox)^*(W/L)$.

$$I_{P3} = \frac{\mu_{P3} * C_{OXP3}}{2} * \left(\frac{W_{P3}}{L_{P3}}\right) * (V_{CC} - V_{IL} - V_{THP3})^2 \quad \text{[Equation 5]}$$

$$I_{P3} = \frac{\beta_{P3}}{2} * (V_{CC} - V_{IL} - V_{THP3})^2$$

In addition, a current $I_{N3}$ flowing to the third NMOS transistor N3 may be represented by the following Equation 6.

$$I_{N3} = \frac{\mu_{N3} * C_{OXN3}}{2} * \left(\frac{W_{N3}}{L_{N3}}\right) * (V_{IL} - V_{THN3})^2 \quad \text{[Equation 6]}$$

Since the current flows from the third PMOS transistor P3 to the third NMOS transistor N3, the first reference level may be represented by the following Equation 7. Here, $\alpha_2$ is $(V_{IL}-V_{THN})/(V_{CC}-V_{IL}-V_{THP})$.

$$V_{IL} = \frac{\alpha_2 * V_{CC} - \alpha_2 * V_{THP} + V_{THN}}{\alpha_2 + 1} \quad \text{[Equation 7]}$$

Here, in the case in which the driving voltage $V_{CC}$, a threshold voltage of the third PMOS transistor P3, and a threshold voltage of the third NMOS transistor N3 are constant, the second reference level may be changed by changing a value of $\alpha_2$. A minimum value of $V_{IL}$ that may be changed by changing the value of $\alpha_2$ may be represented by the following Equation 8.

$$\lim_{\alpha_2 \to 0} V_{IL} = V_{THN} \quad \text{[Equation 8]}$$

As seen in Equation 8, when the value of $\alpha_2$ is decreased, the voltage $V_{IL}$ may be decreased up to $V_{THN}$. The case of decreasing $\alpha_2$ corresponds to the case in which a ratio (W/L) of a width to a length of the third NMOS transistor N3 is designed to be larger than that of the third PMOS transistor P3.

That is, in the case in which the voltage level of the input signal decreases, the ratio (W/L) of a width to a length of the third NMOS transistor N3 may be designed to be larger than the ratio (W/L) of a width to a length of the third PMOS transistor P3 in order for the first reference level of the two-input NAND gate 210 determining the high or low level of the input signal to have a value lower than the intermediate level ($V_{CC}/2$) of the driving voltage.

Figure 6:
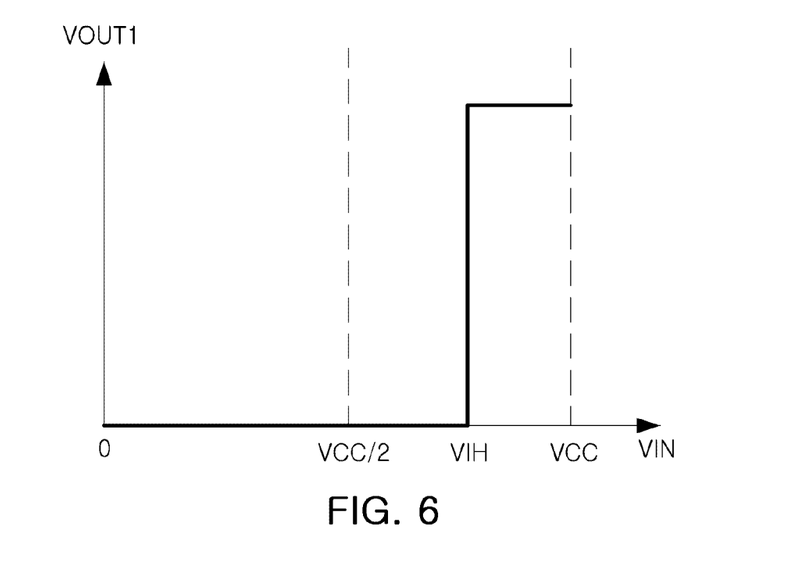
FIGS. 6 through 8 are graphs showing an output signal according to the input signal.
Figure 7:
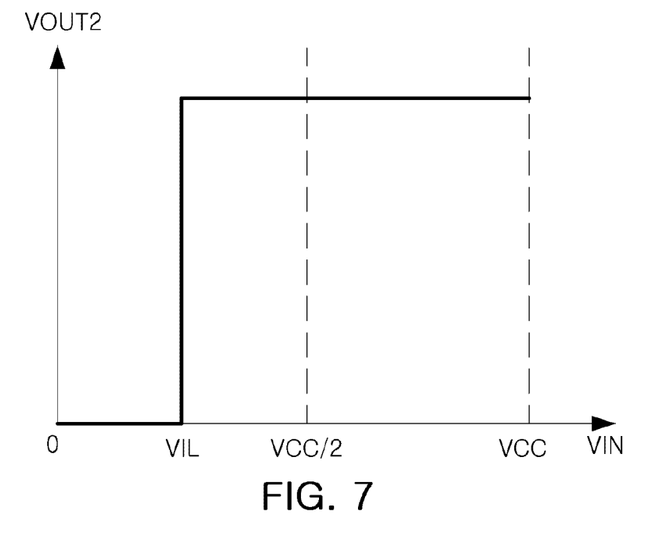
Figure 8:
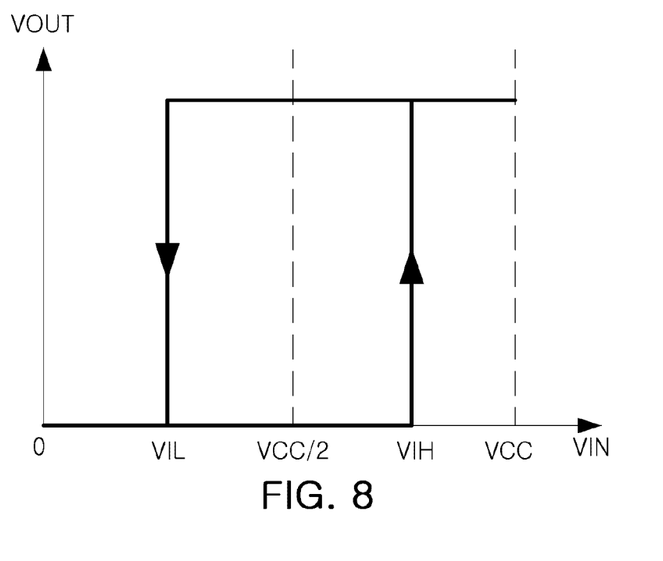

FIGS. 6 through 8 are graphs showing an output signal according to the input signal.

FIG. 6 is a graph showing an output signal according to an input signal in the case in which a voltage level of the input signal increases. Referring to FIG. 4, in the case in which the voltage level of the input signal increases, the output voltage of the input buffer circuit may be output through the first output terminal OUT1. The second PMOS transistor P2 is completely turned on, such that the two-input NOR gate 110 may be operated as an inverter based on the first reference level and the output signal of the two-input NOR gate 110 may be inverted by the first inverter 310. Therefore, the output signal of the input buffer circuit may have a waveform as shown in FIG. 6.

FIG. 7 is a graph showing an output signal according to an input signal in the case in which a voltage level of the input signal decreases. Referring to FIG. 5, in the case in which the voltage level of the input signal decreases, the output voltage of the input buffer circuit may be output through the second output terminal OUT2. The fourth NMOS transistor N4 is completely turned on, such that the two-input NAND gate 210 may be operated as an inverter based on the second reference level and the output signal of the two-input NAND gate 210 may be inverted by the second inverter 320. Therefore, the output signal of the input buffer circuit may have a waveform as shown in FIG. 7.

FIG. 8 is a graph showing both of the graphs of FIGS. 6 and 7. It can be appreciated from FIG. 8 that the input buffer circuit according to the embodiment of the present invention has hysteresis characteristics.

Figure 9:
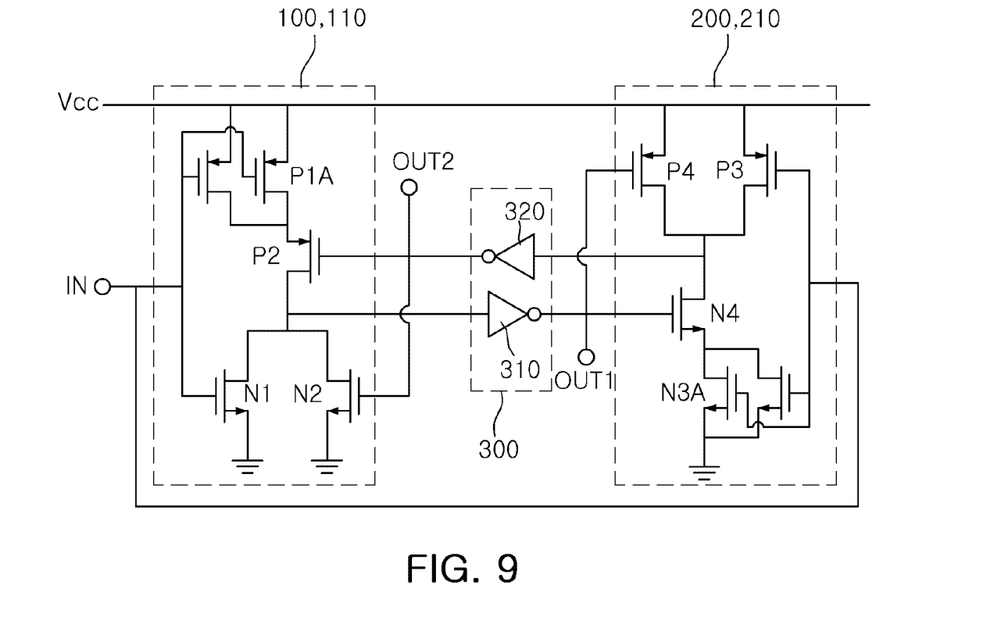
FIG. 9 is a circuit diagram of the input buffer circuit according to the embodiment of the present invention.

FIG. 9 is a circuit diagram of the input buffer circuit according to the embodiment of the present invention. Referring to FIG. 9, the input buffer circuit shown in FIG. 9 may include a first operating unit 100, a second operating unit 200, and an inverting unit 300. A difference between the respective components of the input buffer circuit of FIG. 9 and the above-mentioned components will be mainly described.

Referring to FIGS. 3 and 9, it can be appreciated that the first operating unit 100 including a two-input NOR gate 110 of FIG. 9 includes a first PMOS transistor array P1A instead of the first PMOS transistor P1, unlike the first operating unit 100 of FIG. 3. It can be appreciated that PMOS transistors are connected in parallel with each other instead of increasing the ratio (W/L) of a width to a length of the first PMOS transistor P1 as compared with the ratio (W/L) of a width to a length of the first NMOS transistor N1, in order for the first reference level to have a value higher than the intermediate level ($V_{CC}/2$) of the driving voltage.

In addition, it can be appreciated that the second operating unit 200 including a two-input NAND gate 210 of FIG. 9 includes a third NMOS transistor array N3A instead of the third NMOS transistor N3, unlike the second operating unit 200 of FIG. 3. It can be appreciated that NMOS transistors are connected in parallel with each other instead of increasing the ratio (W/L) of a width to a length of the third NMOS transistor N3 as compared with the ratio (W/L) of a width to a length of the third PMOS transistor P3, in order for the second reference level to have a value lower than the intermediate value ($V_{CC}/2$) of the driving voltage.

As set forth above, according to the embodiment of the present invention, sizes of an input terminal PMOS transistor and an input terminal NMOS transistor are adjusted, whereby a hysteresis level may be easily determined.

In addition, the input terminal is operated as an inverter, whereby a structure may be simplified.

While the present invention has been shown and described in connection with the embodiments, it will be apparent to those skilled in the art that modifications and variations can be made without departing from the spirit and scope of the invention as defined by the appended claims.

What is claimed is:

1. An input buffer circuit comprising:
   a first operating unit performing a NOR operation on an input signal and a first signal;
   a second operating unit performing a NAND operation on the input signal and a second signal; and
   an inverting unit inverting outputs of the first and second operating units to generate a second signal and a first signal, respectively,
   reference levels of the first and second operating units determining a high or low level of the input signal being set to be different.

2. The input buffer circuit of claim 1, wherein the reference level of the first operating unit is higher than that of the second operating unit.

3. The input buffer circuit of claim 1, wherein the first operating unit includes a two-input NOR gate receiving the input signal and the first signal.

4. The input buffer circuit of claim 1, wherein the second operating unit includes a two-input NAND gate receiving the input signal and the second signal.

5. The input buffer circuit of claim 1, wherein the inverting unit includes:
   a first inverter inverting the output of the first operating unit to generate the second signal; and
   a second inverter inverting the output of the second operating unit to generate the first signal.

6. An input buffer circuit comprising:
   a two-input NOR gate including a first p-type metal oxide semiconductor (PMOS) transistor and a first n-type MOS (NMOS) transistor respectively having an input signal applied thereto and a second PMOS transistor and a second NMOS transistor respectively having a first signal applied thereto;
   a first inverter inverting an output signal of the two-input NOR gate to generate a second signal;

a two-input NAND gate including a third PMOS transistor and a third NMOS transistor respectively having the input signal applied thereto and a fourth PMOS transistor and a fourth NMOS transistor respectively having the second signal applied thereto; and a second inverter inverting an output signal of the two-input NAND gate to generate the first signal, reference levels of the two-input NOR gate and the two-input NAND gate determining a high or low level of the input signal being set to be different.

7. The input buffer circuit of claim 6, wherein the reference level of the two-input NOR gate is higher than that of the two-input NAND gate.

8. The input buffer circuit of claim 6, wherein the reference level of the two-input NOR gate is determined by ratios of widths to lengths of the first PMOS transistor and the first NMOS transistor, and the reference level of the two-input NAND gate is determined by ratios of widths to lengths of the third PMOS transistor and the third NMOS transistor.

9. The input buffer circuit of claim 8, wherein the ratio of a width to a length of the first PMOS transistor is larger than that of the first NMOS transistor.

10. The input buffer circuit of claim 8, wherein the ratio of a width to a length of the third PMOS transistor is smaller than that of the third NMOS transistor.

11. An input buffer circuit comprising:

a two-input NOR gate including a first PMOS transistor array and a first NMOS transistor respectively having an input signal applied thereto and a second PMOS transistor and a second NMOS transistor respectively having a first signal applied thereto;

a first inverter inverting an output signal of the two-input NOR gate to generate a second signal;

a two-input NAND gate including a third PMOS transistor and a third NMOS transistor array respectively having the input signal applied thereto, and a fourth PMOS transistor and a fourth NMOS transistor respectively having the second signal applied thereto; and a second inverter inverting an output signal of the two-input NAND gate to generate the first signal, reference levels of the two-input NOR gate and the two-input NAND gate determining a high or low level of the input signal being set to be different.

12. The input buffer circuit of claim 11, wherein the reference level of the two-input NOR gate is higher than that of the two-input NAND gate.

* * * * *